US012713800B2

(12) United States Patent
Zhou et al.

(10) Patent No.: US 12,713,800 B2
(45) Date of Patent: Aug. 18, 2026

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yang Zhou, Beijing (CN); Lu Bai, Beijing (CN); Junxiu Dai, Beijing (CN); Yi Qu, Beijing (CN); Tinghua Shang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 623 days.

(21) Appl. No.: 18/019,036

(22) PCT Filed: Jan. 30, 2022

(86) PCT No.: PCT/CN2022/075223

§ 371 (c)(1),
(2) Date: Jan. 31, 2023

(87) PCT Pub. No.: WO2023/142119

PCT Pub. Date: Aug. 3, 2023

(65) Prior Publication Data

US 2024/0260369 A1 Aug. 1, 2024

(51) Int. Cl.

| | |
|---|---|
| ***H10K 59/35*** | (2023.01) |
| ***H10K 59/121*** | (2023.01) |

(Continued)

(52) U.S. Cl.
CPC ....... *H10K 59/353* (2023.02); *H10K 59/1213* (2023.02); *H10K 59/122* (2023.02); *H10K 59/131* (2023.02); *H10K 59/88* (2023.02)

(58) Field of Classification Search
CPC ............. H10K 59/353; H10K 59/1213; H10K 59/122; H10K 59/131; H10K 59/88; H10D 86/00; G09G 3/3208
See application file for complete search history.

(56) References Cited

U.S. PATENT DOCUMENTS 11,943,984 B2 * 3/2024 Dai ...................... H10K 59/353
2015/0228223 A1 8/2015 Park
(Continued)

FOREIGN PATENT DOCUMENTS

CN 104701352 A * 6/2015 ........... H10K 59/131
CN 111769148 A 10/2020
(Continued)

OTHER PUBLICATIONS

Fang et. al., "Increasing image resolution on portable displays by subpixel rendering—a systematic overview", APSIPA Transactions on Signal and Information Processing: vol. 1: No. 1, e1. (Year: 2012).*

(Continued)

*Primary Examiner* — Steven B Gauthier
*Assistant Examiner* — Alvin L Lee
(74) *Attorney, Agent, or Firm* — MUNCY, GEISSLER, OLDS & LOWE, P.C.

(57) ABSTRACT

A display panel is provided, which includes a display region and a border region arranged around the display region. The display panel includes: a base substrate; a plurality of edge sub-pixels arranged on the base substrate, the plurality of edge sub-pixels being arranged at the edge of the display region and close to the border region, the edge sub-pixels (Continued)

including an anode pattern; a first initialization signal bus arranged on the base substrate, at least a part of the first initialization signal bus being arranged in the display region; wherein an orthographic projection of the anode pattern onto the base substrate overlaps an orthographic projection of the first initialization signal bus onto the base substrate at a first overlapping area.

19 Claims, 7 Drawing Sheets

(51) Int. Cl.
*H10K 59/122* (2023.01)
*H10K 59/131* (2023.01)
*H10K 59/88* (2023.01)

(56) References Cited

U.S. PATENT DOCUMENTS

2017/0092698 A1 3/2017 Zou
2017/0345877 A1 11/2017 Hwang
2018/0076270 A1* 3/2018 Kwon .................. H10K 59/352
2020/0013843 A1* 1/2020 Choi .................. H10K 59/1213
2020/0176541 A1* 6/2020 Xu ........................ H10K 50/824
2021/0233989 A1* 7/2021 Li ........................ H10K 59/124
2021/0320157 A1 10/2021 Xiao
2021/0408203 A1 12/2021 Shi et al.
2022/0310708 A1* 9/2022 Dai ...................... H10K 59/353
2024/0265863 A1* 8/2024 Zhang .................. G09G 3/3233

FOREIGN PATENT DOCUMENTS

CN 113013202 A 6/2021
CN 113066839 A 7/2021
CN 113348558 A 9/2021
CN 113377229 A 9/2021
CN 113471257 A 10/2021
CN 113690279 A 11/2021
CN 113707683 A 11/2021
EP 3506380 A1 7/2019
WO WO2022011582 A1 1/2022

OTHER PUBLICATIONS

CN Office Action dated Dec. 29, 2025 corresponding to Application No. 202280000133.1, 17 pages.

* cited by examiner

5
Cst2
Cst
Cst1
T5
17
T4
6
T3
11
T2
12
T6
17
14
T1
15
3
T7
13
EL
18
4
VSS

DISPLAY PANEL AND DISPLAY DEVICE

CROSS-REFERENCE TO RELATED APPLICATION

The present application is the U.S. national phase of PCT application No. PCT/CN2022/075223 filed on Jan. 30, 2022, which is incorporated herein by reference in its entirety.

TECHNICAL FIELD

The present disclosure relates to the technical field of displaying, and more particularly, to a display panel and a display device.

BACKGROUND

With the development of an ultra-narrow border of an Active-Matrix Organic Light-Emitting Diode (AMOLED) display panel, the market demand for a peripheral circuit of the display panels is increasing. In addition, there is an increasing demand for the quality of the multi-angle color deviation of the display.

SUMMARY

In order to solve the above technical problem, the embodiments of the present disclosure provide the following technical solutions.

A first aspect of the present disclosure provides a display panel including a display region and a border region arranged at a side of the display region, the display panel including: a base substrate; a plurality of edge sub-pixels arranged on the base substrate, the plurality of edge sub-pixels being arranged at the edge of the display region and close to the border region, the edge sub-pixels including an anode pattern; a first initialization signal bus arranged on the base substrate, at least a part of the first initialization signal bus being arranged in the display region; wherein an orthographic projection of the anode pattern onto the base substrate overlaps an orthographic projection of the first initialization signal bus onto the base substrate at a first overlapping area.

Optionally, the display panel further includes: a first source/drain metal layer arranged between the base substrate and the anode pattern, wherein the first initialization signal bus is made using the first source/drain metal layer.

Optionally, the display panel further includes: a power supply signal line, wherein at least one of the edge sub-pixels includes an edge sub-pixel driving circuit, the power supply signal line is configured for providing a power supply voltage to the edge sub-pixel driving circuit, the power supply signal line is made using the first source/drain metal layer, and the orthographic projection of the anode pattern onto the base substrate overlaps an orthographic projection of the power supply signal line onto the base substrate at a second overlapping area.

Optionally, the first overlapping area and the second overlapping area are arranged at two opposite sides of the anode pattern.

Optionally, a ratio of an area of the first overlapping area to an area of the second overlapping area is 0.8-1.2.

Optionally, the display panel further includes: a second initialization signal bus arranged on the base substrate, wherein the second initialization signal bus is arranged in the border region and arranged at a side of the first initialization signal bus distal to the edge sub-pixel.

Optionally, the edge sub-pixel driving circuit includes at least a first transistor and a seventh transistor, wherein one of the first transistor and the seventh transistor is coupled to the first initialization signal bus, and the other of the first transistor and the seventh transistor is coupled to the second initialization signal bus.

Optionally, the second initialization signal bus is arranged in a same layer and made of a same material as the first initialization signal bus.

Optionally, the edge sub-pixel further includes: a pixel-defining opening arranged at a side of the anode pattern distal to the base substrate, the pixel-defining opening corresponding to the anode pattern, the area of the pixel-defining opening being smaller than the area of the anode pattern.

Optionally, an orthographic projection of the pixel-defining opening onto the base substrate overlaps the orthographic projection of the first initialization signal bus onto the base substrate at a third overlapping area, and an area of the third overlapping area is smaller than an area of the first overlapping area.

Optionally, the orthographic projection of the pixel-defining opening onto the base substrate does not overlap the orthographic projection of the first initialization signal bus onto the base substrate.

Optionally, the display panel further includes: a first data line, wherein the first data line is configured for providing a data voltage to the edge sub-pixel driving circuit, the first data line and the first source/drain metal layer are made of a same material, the first data line is arranged between the power supply signal line and the first initialization signal bus, and an orthographic projection of the first data line onto the base substrate partially overlaps the orthographic projection of the anode pattern onto the base substrate.

Optionally, the display panel further includes: a dummy data line, wherein the dummy data line is arranged between the first data line and the first initialization signal bus, and an orthographic projection of the dummy data line onto the base substrate partially overlaps the orthographic projection of the anode pattern onto the base substrate.

Optionally, a distance between the dummy data line and the first initialization signal bus is 3 μm-7 μm, and a distance between the first initialization signal bus and the second initialization signal bus is 5 μm-30 μm.

Optionally, a width of the first initialization signal bus is 30 μm-40 μm; a width of the second initialization signal bus is 30 μm-40 μm.

Optionally, the anode pattern includes a main portion and an auxiliary portion coupled to each other, and a center point of the pixel-defining opening coincides with a center point of the main portion of the anode pattern.

Optionally, the first data line and the dummy data line are arranged at two opposite sides of the center point of the anode pattern, respectively.

Optionally, the display panel further includes: a second planarization layer arranged between the anode pattern and the first source/drain metal layer, wherein the planarization layer is configured for planarization between the anode pattern and the first source/drain metal layer.

Optionally, the display panel includes a plurality of sub-pixels, the plurality of sub-pixels are arranged in an Red Green Blue Green (RGBG) format, and the edge sub-pixels are green pixels that are arranged at the edge of the display region and close to the border region.

Optionally, the plurality of sub-pixels are further arranged in a Green Green Red Blue (GGRB) format, a Diamond format, a standard Red Green Blue (s-RGB) format, or a Delta format.

Optionally, the display panel further includes: a second source/drain metal layer arranged on the base substrate, wherein the first initialization signal bus is made using the second source/drain metal layer.

Optionally, the display panel further includes: a Gate on Array (GOA) circuit arranged in the border region, wherein the orthographic projection of the anode pattern onto the base substrate overlaps an orthographic projection of the GOA circuit onto the base substrate at a fourth overlapping area.

A second aspect of the present disclosure provides a display device including the display panel described above.

REFERENCE NUMERALS

Figure 1:
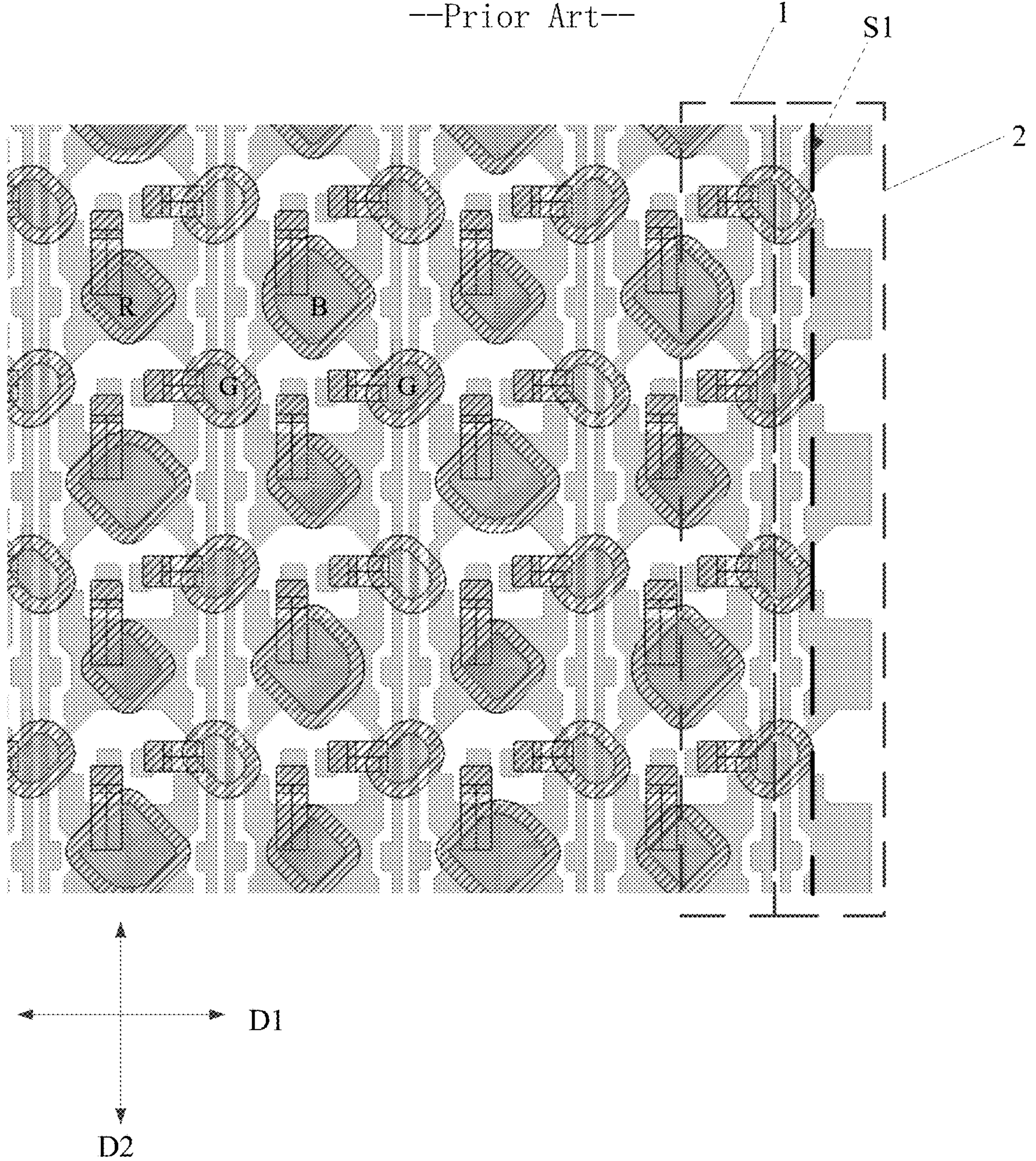
FIG. 1 is a schematic diagram of an anode of an edge sub-pixel raised by using a redundant sub-pixel in the related art.

1 Edge sub-pixel
2 Redundant sub-pixel
10 Anode pattern
20 Pixel-defining opening
3 First initialization signal bus
4 Second initialization signal bus
5 Power supply signal line
6 First data line
7 Dummy data line
1011 Main portion
1021 Auxiliary portion
11—First scanning line 12—Second scanning line 13—Second initialization signal line
14—First reset signal line 15—First initialization signal line 17—Light emission control signal line 18—Second reset signal line
1031 Conductive connection part
S1—First dividing line
S2—Second dividing line
S3—Third dividing line
S4—Fourth dividing line
101 Anode square hole.

DETAILED DESCRIPTION

In order that the technical problems, technical solutions, and advantages to be solved by the embodiments of the present disclosure will become more apparent, a detailed description will be given below with reference to the accompanying drawings and specific embodiments.

As pixel stacking studies advances, those skilled in the art finds that the specification of the color deviation is related to the flatness of the pixel opening, primarily the flatness of the anode. Although the anode is arranged on an upper layer of the pixel stack, and there is a periodic rule between a shape of the anode and the pixel circuit stack, its surface is rough due to existence of wires of the pixel circuit, especially a thick layer of the back plane circuit. For example, in a single source/drain (SD) metal layer product, the SD metal layer of the back plane circuit is thick, and its wires are arranged below the anode pixel opening, which adversely affects the flatness. In a dual-SD metal layer product, since the first planarization layer (PLN1) flattens the fluctuation generated by the first source/drain metal layer (SD1) to some extent, its main influencing factor is the second source/drain metal layer (SD2).

In particular, in the related art, one or more columns of redundant sub-pixels are usually provided at the edge positions of the display region to ensure the flatness of the anode of the edge sub-pixel, but the provision of such redundant sub-pixels occupies the space of the display panel and is unbeneficial to a narrow border design.

Embodiments of the present disclosure provide a display panel and a display device capable of preventing redundant pixels from occupying the space of the display panel by eliminating the redundant sub-pixels.

An embodiment of the present disclosure provides a display panel including a display region and a border region arranged around the display region. The display panel includes: a base substrate; a plurality of edge sub-pixels arranged on the base substrate, the plurality of edge sub-pixels being arranged at the edge of the display region and close to the border region, the edge sub-pixels including an anode pattern; a first initialization signal bus arranged on the base substrate, at least a part of the first initialization signal bus being arranged in the display region; wherein an orthographic projection of the anode pattern onto the base substrate overlaps an orthographic projection of the first initialization signal bus onto the base substrate at a first overlapping area.

In the embodiments of the present disclosure, the power supply signal lines of the redundant pixels are replaced with the first initialization signal bus, so as to raise the anode pattern at the edge of the display region, which may improve the flatness of the light-emitting area, reduce a size of the border of the display device, and improve the display uniformity.

Figure 2:
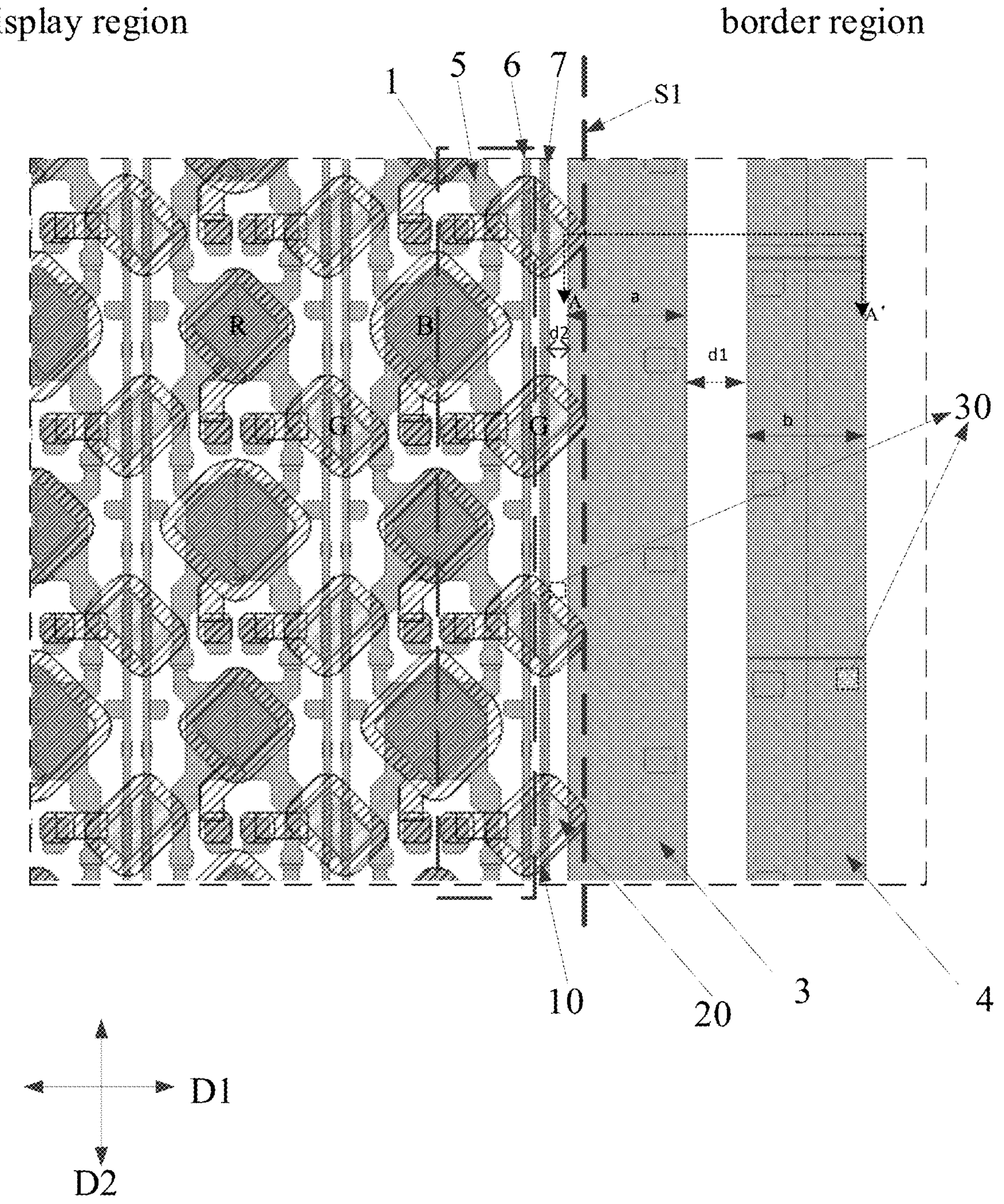
FIG. 2 is a schematic diagram of an anode raised by using a first initialization signal bus according to an embodiment of the present disclosure.

FIG. 2 is a schematic diagram of an anode raised by using a first initialization signal bus according to an embodiment of the present disclosure. As shown in FIG. 2, a display panel includes a display region and a border region arranged at a side of the display region. The display panel includes: a base substrate; a plurality of edge sub-pixels 1 arranged on the base substrate, the plurality of edge sub-pixels 1 being arranged at the edge of the display region and close to the border region, the edge sub-pixels 1 including an anode pattern 10; a first initialization signal bus 3 arranged on the base substrate, at least a part of the first initialization signal bus 3 being arranged in the display region; wherein an orthographic projection of the anode pattern 10 onto the base substrate and an orthographic projection of the first initialization signal bus 3 onto the base substrate have a first overlapping area.

In some embodiments, the base substrate may be a flexible substrate or may be a rigid substrate. The rigid substrate may be, but is not limited to, one or more of glass and quartz, and the flexible substrate may be, but is not limited to, one or more of polyethylene terephthalate, ethylene terephthalate, polyetheretherketone, polystyrene, polycarbonate, polyarylate, polyarylate, polyimide, polyvinyl chloride, polyethylene, and textile fibers.

In some embodiments, the flexible substrate may include a first flexible material layer, a first inorganic material layer, a semiconductor layer, a second flexible material layer and a second inorganic material layer that are stacked. The first flexible material layer and the second flexible material layer may be made of polyimide (PI), polyethylene terephthalate (PET) or a surface-treated polymer soft film. The first inorganic material layer and the second inorganic material layer may be made of silicon nitride (SiNx) or silicon oxide (SiOx), to improve the water-oxygen resistance of the substrate. In addition, the semiconductor layer may be made of amorphous silicon (a-Si).

In some embodiments, the display panel includes a rectangular display region and a border region surrounding the display region, and the border region includes an upper border region, a lower border region, a left border region, a right border region and four corner regions connecting the upper border region, the lower border region, the left border region and the right border region. The arrangements of the upper border region, the lower border region, the left border region and the right border region are substantially the same. The arrangements of the four corner regions are substantially the same.

Figure 7:
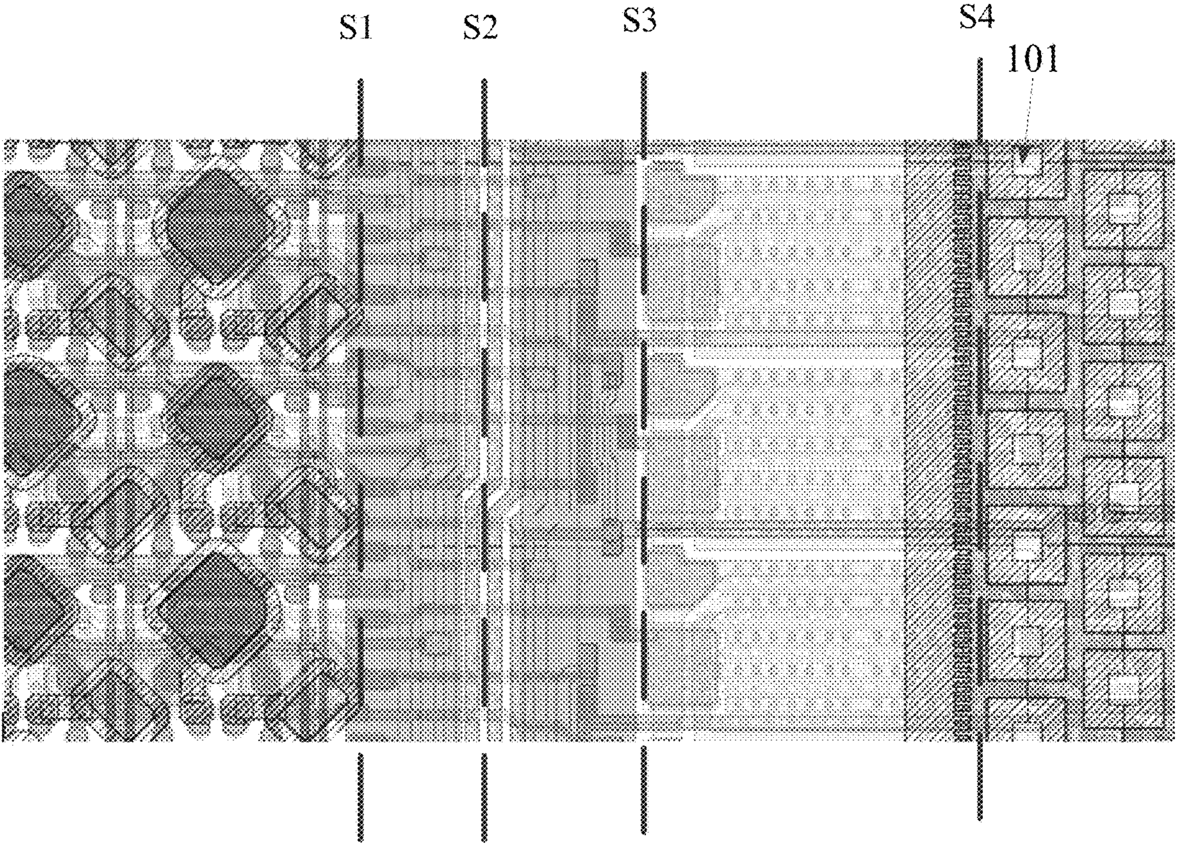
FIG. 7 is a schematic diagram showing a coverage of an evaporation mask for an organic light-emitting functional layer according to an embodiment of the present disclosure.

The boundary of the anode pattern defines the boundary of the display region, as indicated by the first dividing line S1 in FIGS. 1, 2 and 7.

In some embodiments, the display panel includes a plurality of sub-pixels, the plurality of sub-pixels being divided into a plurality of rows of sub-pixels and a plurality of columns of sub-pixels, wherein the plurality of edge sub-pixels are sub-pixels included in a column of sub-pixels of the plurality of columns of sub-pixels that is proximate to the right border or proximate to the left border.

Each sub-pixel includes a corresponding sub-pixel driving circuit, and the plurality of sub-pixels include a plurality of sub-pixel driving circuits distributed in an array. The plurality of sub-pixel driving circuits are divided into a plurality of rows of sub-pixel driving circuits and a plurality of columns of sub-pixel driving circuits.

For example, in FIG. 2, the edge sub-pixels are close to the right border region of the display panel.

The anode pattern is arranged in an anode layer ANO, the anode layer ANO includes a plurality of anode patterns, the plurality of anode patterns are arranged at intervals, and each of the anode patterns is arranged in a sub-pixel region.

In some embodiments, the anode layer ANO includes a first transparent conductive layer, a metal layer, and a second transparent conductive layer stacked in order in a direction away from the base substrate. The transparent conductive layer may be made of Indium Tin Oxide (ITO) or Indium Zinc Oxide (IZO).

In some embodiments, the first initialization signal bus is coupled to a first initialization signal line or a second initialization signal line of the sub-pixel driving circuit for providing the first initialization signal or the second initialization signal to the sub-pixel driving circuit included in each sub-pixel of the display panel.

In the related art, the first initialization signal bus is arranged in the border region and is arranged at a side of the redundant sub-pixels distal to the edge sub-pixels.

In the embodiments of the present disclosure, as can be seen from FIGS. 1 and 2, it may eliminate the redundant sub-pixels and translate the first initialization signal bus to the location of the redundant sub-pixels.

Figure 8:
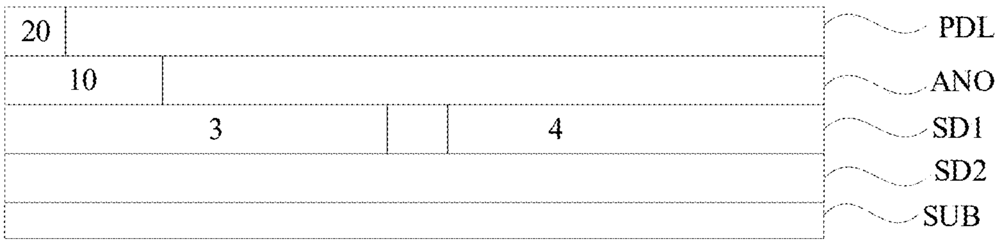
FIG. 8 is a cross-sectional view taken along line AA' in FIG. 2.

FIG. 8 is a cross-sectional view taken along line AA' in FIG. 2. As shown in FIGS. 1, 2 and 8, an orthographic projection of the anode pattern 10 onto the base substrate and an orthographic projection of the first initialization signal bus 3 onto the base substrate have a first overlapping area, namely, the anode pattern 10 is raised by using the first initialization signal bus to make the anode pattern more flat; if the anode pattern is not flat, the light-emitting area corresponding to the anode pattern will not be flat, thus resulting in a certain degree of color deviation, namely, the left and right sides of the same light-emitting area have different colors.

Optionally, the display panel further includes: a first source/drain metal layer SD1 arranged between the base substrate and the anode pattern, wherein the first initialization signal bus is made using the first source/drain metal layer SD1.

The first initialization signal bus provided by the embodiments of the present disclosure is made using a first source/drain metal layer SD1, which can reduce the number of film layers of the display panel and reduce the process complexity.

In some embodiments, the display panel further includes: a first source/drain metal layer SD1 arranged between the base substrate and the anode pattern 10, wherein the first initialization signal bus 3 is made using the first source/drain metal layer SD1.

In some embodiments, the first source/drain metal layer SD1 may be a metal such as Cu, Al, Ag, Mo, Cr, Nd, Ni, Mn, Ti, Ta, W, or an alloy thereof. The first source/drain metal layer SD1 may be of a single layer structure or a multi-layer structure such as Cu\Mo, Ti\Cu\Ti, Mo\Al\Mo, etc. The thickness of the first source/drain metal layer SD1 is approximately 2000-4000 Å.

Optionally, the display panel further includes: a power supply signal line, wherein at least one of the edge sub-pixels includes an edge sub-pixel driving circuit, the power supply signal line is configured for providing a power supply voltage to the edge sub-pixel driving circuit, the power supply signal line is made using the first source/drain metal layer SD1, and the orthographic projection of the anode pattern onto the base substrate overlaps an orthographic projection of the power supply signal line onto the base substrate at a second overlapping area.

In the embodiments of the present disclosure, the orthographic projection of the anode pattern onto the base substrate and the orthographic projection of the power supply signal line onto the base substrate have a second overlapping area, so raise the anode pattern by using the power supply signal line.

Figure 3:
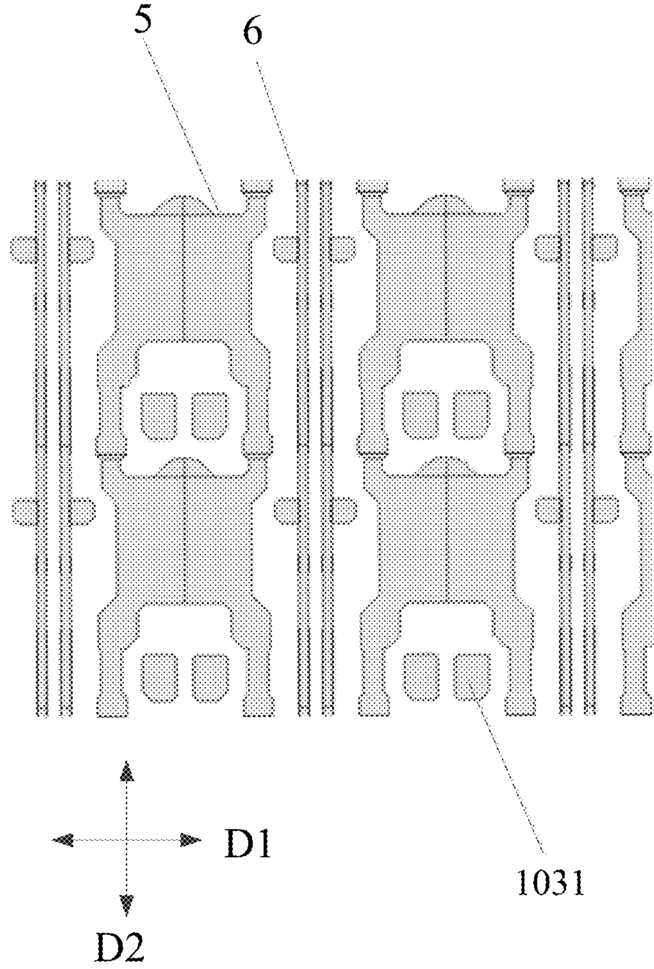
FIG. 3 is a schematic diagram showing an arrangement of a first source/drain metal layer according to an embodiment of the present disclosure.

Referring to FIGS. 2 and 3, the power supply signal line 5 is made using the first source/drain metal layer SD1. At least a part of the power supply signal line 5 extends in the second direction.

Optionally, the first overlapping area and the second overlapping area are arranged at two opposite sides of the anode pattern, respectively.

In the embodiments of the present disclosure, the first overlapping area and the second overlapping area are arranged at two opposite sides of the anode pattern, so as to raise the left and right corners of the anode pattern, prevent the raised position of the anode pattern from being asymmetric, and prevent the left and right inclination angles from being different and resulting in color deviation.

Optionally, a ratio of an area of the first overlapping area to an area of the second overlapping area is 0.8-1.2.

In the embodiments of the present disclosure, the ratio of an area of the first overlapping area to an area of the second overlapping area is 0.8-1.2, so as to enable the left and right corners of the anode pattern to be raised with approximately the same area, enable the left and right sides of the anode pattern to have the same color deviation, and enable the display color to be more uniform.

Optionally, the display panel further includes: a second initialization signal bus arranged on the base substrate, wherein the second initialization signal bus is arranged in the border region and arranged at a side of the first initialization signal bus distal to the edge sub-pixel.

In the embodiments of the present disclosure, a second initialization signal bus is provided, which may be in conjunction with the first initialization signal bus to provide the edge sub-pixel driving circuit with an initialization signal.

Optionally, the edge sub-pixel driving circuit includes at least a first transistor and a seventh transistor, wherein one of the first transistor and the seventh transistor is coupled to the first initialization signal bus; the other of the first transistor and the seventh transistor is coupled to the second initialization signal bus.

In the embodiments of the present disclosure, the first initialization signal bus and the second initialization signal bus are provided, so as to provide different initialization signals for the first transistor and the seventh transistors.

Optionally, the second initialization signal bus is arranged in a same layer and made of a same material as the first initialization signal bus.

The second initialization signal bus provided in the embodiments of the present disclosure is provided in the same layer and made of the same material as the first initialization signal bus, namely, the second initialization signal bus is also made using the first source/drain metal layer SD1, which can reduce the number of film layers of the display panel and reduce the process complexity.

It is to be noted that the above-mentioned "same layer" refers to a layer structure in which a film layer for forming a specific pattern is formed by the same film forming process and then formed by one patterning process using the same mask. Depending on the particular pattern, one patterning process may include multiple exposure, development, or etching processes, and the particular pattern in the formed layer structure may or may not be continuous, and the particular patterns may be at different heights or have different thicknesses.

Optionally, the edge sub-pixel further includes: a pixel-defining opening arranged at a side of the anode pattern distal to the base substrate, the pixel-defining opening corresponding to the anode pattern, the area of the pixel-defining opening being smaller than the area of the anode pattern.

The pixel-defining opening of embodiments of the present disclosure define an effective light-emitting area of the pixel.

Optionally, an orthographic projection of the pixel-defining opening onto the base substrate and the orthographic projection of the first initialization signal bus onto the base substrate have a third overlapping area, and an area of the third overlapping area is smaller than an area of the first overlapping area.

Optionally, the orthographic projection of the pixel-defining opening onto the base substrate does not overlap the orthographic projection of the first initialization signal bus onto the base substrate.

The pixel-defining opening of the embodiments of the present disclosure may or may not be raised by the first initialization signal bus.

Optionally, the display panel further includes: a first data line, wherein the first data line is configured for providing a data voltage to the edge sub-pixel driving circuit, the first data line is made using the first source/drain metal layer SD1 and is arranged between the power supply signal line and the first initialization signal bus, and an orthographic projection of the first data line onto the base substrate partially overlaps the orthographic projection of the anode pattern onto the base substrate.

In the embodiments of the present disclosure, the orthographic projection of the first data line onto the base substrate is partially overlapped with the orthographic projection of the anode pattern onto the base substrate, to enable the first data line to raise a central portion of the anode pattern.

Optionally, the display panel further includes: a dummy data line, wherein the dummy data line is arranged between the first data line and the first initialization signal bus, and an orthographic projection of the dummy data line onto the base substrate partially overlaps the orthographic projection of the anode pattern onto the base substrate.

In the embodiments of the present disclosure, the orthographic projection of the dummy data line onto the base substrate is overlapped with the orthographic projection of the anode pattern onto the base substrate, to enable the dummy data line to raise the central portion of the anode pattern.

It is to be noted that the dummy data line does not provide a data voltage signal and is not coupled to the sub-pixel driving circuit.

In the embodiments of the present disclosure, the first data line 6 and the dummy data line 7 are arranged at two opposite sides of the center point of the anode pattern respectively, so as to enable the first data line and the dummy data line to raise the central portion of the anode pattern with a same level at left and right sides.

The first data line and the dummy data line are both made using the first source/drain metal layer SD1, and the first source/drain metal layer SD1 is arranged at a side of the anode pattern proximate to the base substrate. The first data line and the dummy data line both extend in the second direction D2.

Optionally, a distance d2 between the dummy data line and the first initialization signal bus is 3 μm-7 μm, and a distance d1 between the first initialization signal bus and the second initialization signal bus is 5 μm-30 μm.

In the embodiments of the present disclosure, it sets a distance d2 between the dummy data line and the first initialization signal bus to be 3 μm-7 μm. Compared with the related art, the distance between the dummy data line and the first initialization signal bus is a substantially reduced, that is to say, the first initialization signal bus originally arranged in the border region is translated in the direction where the display region is arranged, to occupy the position originally provided for the redundant sub-pixels, which is beneficial to the realization of the narrow border.

Optionally, a width a of the first initialization signal bus is 30 μm-40 μm, and a width b of the second initialization signal bus is 30 μm-40 μm.

In the embodiments of the present disclosure, it can ensure the wire arrangement on the first initialization signal bus and the second initialization signal bus by setting the width of the first initialization signal bus and the width of the second initialization signal bus.

Optionally, the anode pattern includes a main portion and an auxiliary portion coupled to each other, and a center point of the pixel-defining opening coincides with a center point of the main portion of the anode pattern.

In the embodiments of the present disclosure, it provides a display panel in which the auxiliary portion of the anode pattern enables the main portion of the anode pattern to be coupled to the drain electrode of a light emission control transistor.

In the embodiments of the present disclosure, it provides a display panel in which the center point of the pixel-defining opening coincides with the center point of the main portion of the anode pattern, so that the flatness of the anode pattern is consistent with the flatness of the pixel-defining opening, and the flatness of the light-emitting area corresponding to the pixel-defining opening can be ensured and color deviation can be avoided.

Figure 4:
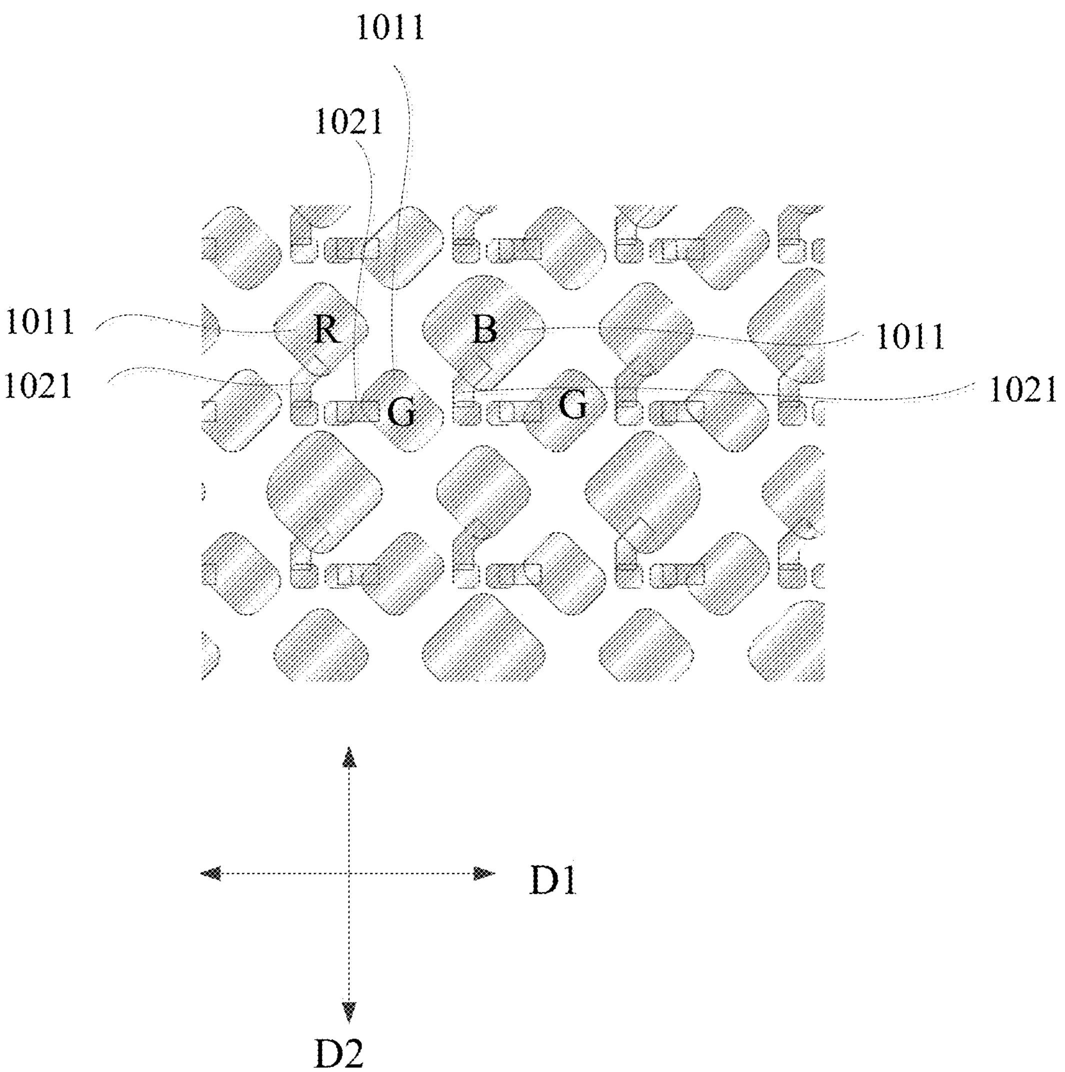
FIG. 4 is a schematic diagram showing an arrangement of an anode pattern according to an embodiment of the present disclosure.

FIG. 4 is a schematic diagram showing an arrangement of an anode pattern according to an embodiment of the present disclosure. As shown in FIG. 4, the anode pattern includes a main portion 1011 and an auxiliary portion 1021, wherein the area of the main portion of the B pixel is larger than the area of the main portion of the R pixel, and the area of the main portion of the R pixel is larger than the area of the main portion of the G pixel.

Figures 5, 6:
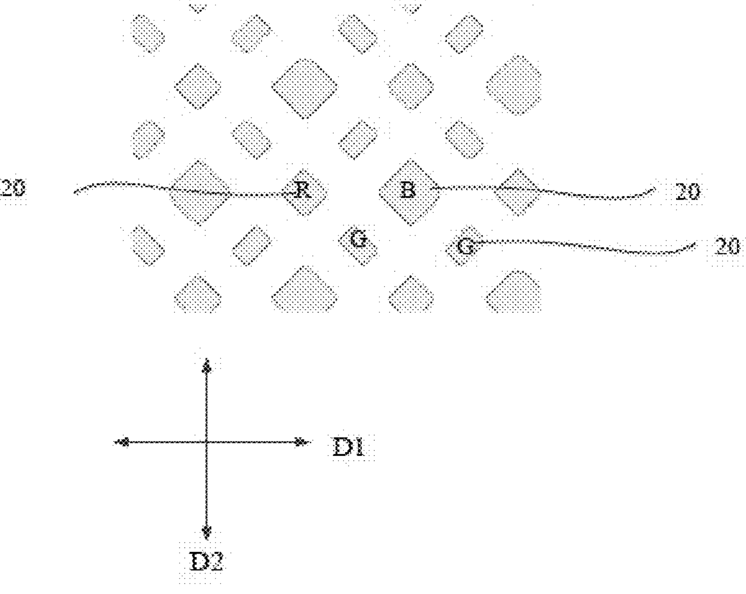
FIG. 5 is a schematic diagram showing an arrangement of a pixel-defining opening according to an embodiment of the present disclosure.
FIG. 6 is a circuit diagram of an edge sub-pixel driving circuit according to an embodiment of the present disclosure.

FIG. 5 is a schematic diagram showing an arrangement of a pixel-defining opening according to an embodiment of the present disclosure. As shown in FIG. 5, the area of the pixel-defining opening of the B pixel is greater than the area of the pixel-defining opening of the R pixel, and the area of the pixel-defining opening of the R pixel is greater than the area of the pixel-defining opening of the G pixel.

Optionally, the display panel further includes: a planarization layer arranged between the anode pattern and the first source/drain metal layer SD1, wherein the planarization layer is configured for implementing the planarization between the anode pattern and the first source/drain metal layer SD1.

In some embodiments, the planarization layer may be made of an organic material.

In the display panel of the embodiments of the present disclosure, it flattens the first source/drain metal layer SD1 through the planarization layer, so that the anode pattern arranged above the first source/drain metal layer SD1 is more flat.

Optionally, the display panel includes a plurality of sub-pixels, the plurality of sub-pixels are arranged in an RGBG format, and the edge sub-pixels are G pixels that are arranged at the edge of the display region and close to the border region.

The embodiments of the present disclosure provide a display panel in which the plurality of sub-pixels are arranged in a RGBG format, which can improve display contrast. The anode patterns of the R pixels and the B pixels are raised by a large piece of metal to ensure the flatness of the anode patterns of the R pixels and the B pixels; the left corner of the anode pattern of the G pixel is raised by the power supply signal line, the right corner of the anode pattern of the G pixel is raised by the first initialization signal bus, and the center of the anode pattern of the G pixel is raised by the first data line and the dummy data line, so as to ensure the flatness of the anode pattern of the G pixel.

Optionally, the arrangement format of the plurality of sub-pixels further includes: GGRB, Diamond, s-RGB or Delta.

The embodiments of the present disclosure provide a display panel, and the plurality of sub-pixels may also be arranged in a format of GGRB, Diamond, s-RGB or Delta.

It should be noted that the edge sub-pixel may not only be a G-pixel, but may also be an R-pixel or a B-pixel if other pixel arrangements are used.

The pixel-defining opening defines an effective light-emitting area of an R pixel, a B pixel, or a G pixel. As shown in FIGS. 1, 2, 4, and 5, the effective light-emitting area of the B pixel is greater than the effective light-emitting area of the R pixel, and the effective light-emitting area of the R pixel is greater than the effective light-emitting area of the G pixel.

Optionally, the display panel further includes: a second source/drain metal layer SD2 arranged on the base substrate, wherein the first initialization signal bus is made using the second source/drain metal layer SD2.

Optionally, the display panel further includes: a second source/drain metal layer SD2 arranged on the base substrate, wherein the second initialization signal bus is made using the second source/drain metal layer SD2.

The first initialization signal bus 3 and the second initialization signal bus 4 may be arranged in either one of the first source/drain metal layer SD2 and the second source/drain metal layer SD2.

In addition, the orthographic projection of the anode pattern onto the base substrate may also overlap the orthographic projection of the data line bus onto the base substrate, i.e. the anode pattern may also be raised by using the data line bus.

Further, the anode pattern can also be raised by using VSS lines.

Similarly, the first data line 6 and the dummy data line 7 may be arranged in any one of the first source/drain metal layer SD1 and the second source/drain metal layer SD2. The power supply signal line 5 may also be arranged in either one of the first source/drain metal layer SD1 and the second source/drain metal layer SD2.

In some embodiments, the second source/drain metal layer SD2 may be made of a metal such as Cu, Al, Ag, Mo, Cr, Nd, Ni, Mn, Ti, Ta, W, or an alloy of thereof. The second source/drain metal layer SD2 may be of a single layer structure or a multi-layer structure such as Cu\Mo, Ti\Cu\Ti, Mo\Al\Mo, etc. The thickness of the second source/drain metal layer SD2 is approximately 2000-4000 Å.

It should be noted that the first source/drain metal layer SD1 and the second source/drain metal layer SD2 are relative concepts, and are distinguished according to whether the display panel is a dual-SD metal layer product or a single SD metal layer product. In a dual-SD metal layer product, since the first planarization layer (PLN1) flattens the fluctuation generated by the first source/drain metal layer (SD1) to some extent, its main influencing factor is the second source/drain metal layer (SD2). In a single source/drain (SD) metal layer product, the SD metal layer of the back plane circuit has a thicker film layer, and its wires are arranged below the anode pixel opening, which has a certain effect on the flatness.

Optionally, the display panel further includes: a GOA circuit 30 arranged in the border region, wherein the orthographic projection of the anode pattern onto the base substrate and an orthographic projection of the GOA circuit 30 onto the base substrate have a fourth overlapping area.

In the display panel of the embodiments of the present disclosure, the anode pattern is raised by using the GOA circuit 30. Since the GOA circuit 30 is arranged at a position of the second initialization signal bus that is remote from the first initialization signal bus, it is capable of further narrowing the border.

FIG. 6 is a circuit diagram of an edge sub-pixel driving circuit according to an embodiment of the present disclosure.

Each edge sub-pixel includes an edge sub-pixel driving circuit including at least a first transistor T1 and a drive transistor T3. A second electrode of the first transistor T1 is coupled to a gate electrode of the drive transistor T3.

The display substrate further includes: a plurality of first reset signal lines 14, wherein the gate electrode of the first transistor T1 is coupled to the first reset signal lines 14; the initialization signal line includes a first initialization signal line 15 and a second initialization signal line 13; a first electrode of the first transistor T1 is coupled to the first initialization signal line 15.

The display substrate further includes: a plurality of power supply signal lines 5, a plurality of light emission control signal lines 17, a plurality of first data lines 6 and a plurality of second reset signal lines 18; the scanning line includes a first scanning line 11 and a second scanning line 12; the sub-pixel driving circuit further includes a compensation transistor T2, a data writing transistor T4, a first light emission control transistor T5, a sixth transistor T6, a seventh transistor T7 and a storage capacitor Cst; a first electrode of the compensation transistor T2 is coupled to a second electrode of the driving transistor T3, a second electrode of the compensation transistor T2 is coupled to a gate electrode of the driving transistor T3, and a gate electrode of the compensation transistor T2 is coupled to the first scanning line 11; a first electrode of the data writing transistor T4 is coupled to a corresponding first data line 6, a second electrode of the data writing transistor T4 is coupled to a first electrode of the driving transistor T3, and a gate electrode of the data writing transistor T4 is coupled to the second scanning line 12; a gate electrode of the first light emission control transistor T5 is coupled to a corresponding light emission control signal line 17, a first electrode of the first light emission control transistor T5 is coupled to the power supply signal line 5, and a second electrode of the first light emission control transistor T5 is coupled to the first electrode of the drive transistor T3; a gate electrode of the sixth transistor T6 is coupled to a corresponding light emission control signal line 17, a first electrode of the sixth transistor T6 is coupled to the second electrode of the driving transistor T3, a second electrode of the sixth transistor T6 is coupled to an anode of the light-emitting element EL, and a cathode of the light-emitting element EL receives a negative power supply signal VSS; the gate electrode of the seventh transistor T7 is coupled to the second reset signal line 18, the second electrode of the seventh transistor T7 is coupled to the second electrode of the sixth transistor T6, and the first electrode S7 of the seventh transistor T7 is coupled to the second initialization signal line 13.

For example, the second reset signal line 18 coupled to the gate electrode of the seventh transistor T7 in the current sub-pixel driving circuit is a same line as the first scanning line 11 coupled to the gate electrode of the data write transistor T4 in the sub-pixel driving circuit that is adjacent to the current sub-pixel driving circuit in the first direction.

A first plate Cst1 of the storage capacitor Cst further functions as the gate electrode T3-*g* of the driving transistor T3, and a second plate Cst2 of the storage capacitor Cst is coupled to the power supply signal line 5.

It is to be noted that the second initialization signal line 13 may be coupled to either the first initialization signal bus 3 or the second initialization signal bus 4.

The first initialization signal line 15 may be coupled to either the first initialization signal bus 3 or the second initialization signal bus 4.

In the case that the display panel is a dual-SD metal layer product, and the above-mentioned sub-pixel is being manufactured, an arrangement of each film layer corresponding to the sub-pixel is as follows: it includes a light-shielding layer, an active layer, a first gate insulating layer, a first gate metal layer, a second gate insulating layer, a second gate metal layer, a first interlayer insulating layer, an Indium Gallium Zinc Oxide (IGZO) layer, a third gate insulating layer, a third gate metal layer, a second interlayer insulating layer, a second source/drain metal layer SD2, a first protective layer, a first planarization layer, a first source/drain metal layer SD1, a second planarization layer, an anode layer ANO, a pixel definition layer PDL, a spacer layer, an organic light-emitting functional layer and a cathode layer which are stacked and arranged in sequence along the direction away from the substrate SUB.

As shown in FIG. 3, the first data line 6 and the power supply signal line 5 are made using the second source/drain metal layer. In addition, FIG. 3 illustrates a conductive connection part 1031 coupled to the anode of the light-emitting element through a via hole.

FIG. 7 is a schematic diagram showing a coverage of an evaporation mask for an organic light-emitting functional layer according to an embodiment of the present disclosure. In an Active Matrix Organic Light Emitting Display (AMOLED) panel, if the AMOLED device includes a film layer patterned through evaporation, especially a film layer patterned through evaporation by using a conventional mask, there will generally be a non-film-forming region of a certain width. In order to ensure a good uniformity of the light-emitting device, the non-film-forming region is generally arranged outside the display region, i.e. the non-film-forming region occupies a certain frame space.

In the present disclosure, it uses an evaporation process to form an organic light-emitting functional layer. As shown in FIG. 7, the coverage of the evaporation mask of the organic light-emitting functional layer can extend to the position indicated by the second dividing line S2, and the dividing line S2 is arranged between the first initialization signal bus 3 and the second initialization signal bus 4. In addition, the coverage of the evaporation mask of the organic light-emitting functional layer can extend to the position indicated by the third dividing line S3, and the dividing line S3 is arranged at a side of the second initialization signal bus 4 distal to the first initialization signal bus 3. In addition, the coverage of the evaporation mask of the organic light-emitting functional layer can extend to the position indicated by the fourth dividing line S4 to prevent from covering the anode square hole 101 shown in FIG. 7.

Figure 9:
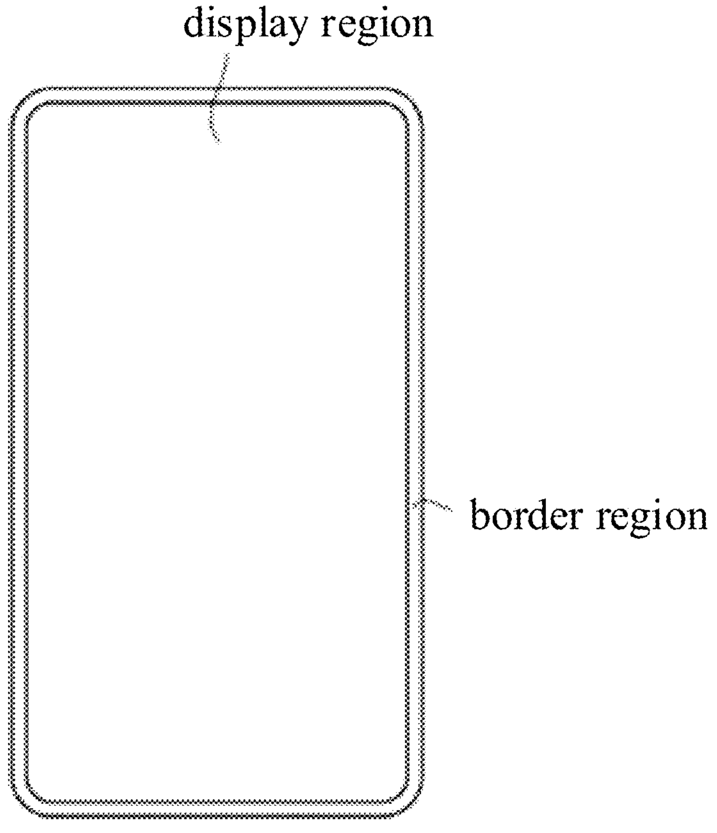
FIG. 9 is a schematic diagram of a display device according to some embodiments of the present disclosure.

Referring to FIG. 9, some embodiments of the present disclosure also provide a display device. The display device includes the display substrate as described above. The display device may further include, but is not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not intended to be limiting and that the display device may include more or fewer of the components described above, or some combinations of the components, or different arrangements of the components. In the embodiments of the present disclosure, the display device includes, but is not limited to, a display, a cell phone, a tablet, a television, a wearable electronic device, a navigation display device, etc.

The display device may be any product or component with a display function, such as a liquid crystal television, a liquid crystal display, a digital photo frame, a mobile phone, or a tablet computer, wherein the display device further includes a flexible circuit board, a printed circuit board and a back panel.

In the various method embodiments of the present disclosure, the serial number of each step cannot be used to define the order of each step, and those skilled in the art may change the order of each step without any inventive effort, which also falls within the scope of the present disclosure.

It should be noted that the various embodiments described herein are described in a progressive manner with reference to the same or similar parts throughout the various embodiments, with each embodiment focusing on the differences from the other embodiments. In particular, the method embodiments are described in a relatively simple manner, because they are substantially similar to the product embodiments, with reference to the related description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or an intervening element may be present.

In the above description, particular features, structures, materials, or characteristics may be combined in any suitable manner in any one or more embodiments or examples.

While the present disclosure has been described with reference to specific embodiments thereof, it will be understood by those skilled in the art that various changes may be made and equivalents may be substituted for elements thereof without departing from the scope of the disclosure. Therefore, the protection scope of the present disclosure should be determined by the protection scope of the claims.

What is claimed is:

1. A display panel comprising a display region and a border region arranged at a side of the display region, wherein the display panel comprises:

a base substrate;

a plurality of edge sub-pixels arranged on the base substrate, the plurality of edge sub-pixels being arranged at an edge of the display region and close to the border region, and at least one of the edge sub-pixels from the plurality of edge sub-pixels comprising an anode pattern;

a first initialization signal bus arranged on the base substrate, and at least a part of the first initialization signal bus being arranged within the display region; and a Gate on Array (GOA) circuit arranged in the border region, wherein an orthographic projection of the anode pattern onto the base substrate overlaps an orthographic projection of the first initialization signal bus onto the base substrate at a first overlapping area, and wherein the orthographic projection of the anode pattern onto the base substrate overlaps an orthographic projection of the GOA circuit onto the base substrate at a fourth overlapping area.

2. The display panel according to claim 1, further comprising:

a first source/drain metal layer arranged between the base substrate and the anode pattern, wherein the first initialization signal bus and the first source/drain metal layer are made of a same material.

3. The display panel according to claim 2, further comprising:

a power supply signal line, wherein at least one of the edge sub-pixels from the plurality of edge sub-pixels comprises an edge sub-pixel driving circuit, the power supply signal line is configured for providing a power supply voltage to the edge sub-pixel driving circuit, the power supply signal line and the first source/drain metal layer are made of a same material, and the orthographic projection of the anode pattern onto the base substrate overlaps an orthographic projection of the power supply signal line onto the base substrate at a second overlapping area.

4. The display panel according to claim 3, wherein the first overlapping area and the second overlapping area are arranged at two opposite sides of the anode pattern, respectively.

5. The display panel according to claim 3, wherein a ratio of an area of the first overlapping area to an area of the second overlapping area is 0.8-1.2.

6. The display panel according to claim 3, further comprising:

a second initialization signal bus arranged on the base substrate, wherein the second initialization signal bus is arranged in the border region, and arranged at a side of the first initialization signal bus distal to the edge sub-pixel, wherein the edge sub-pixel driving circuit comprises at least a first transistor and a seventh transistor, wherein one of the first transistor and the seventh transistor is coupled to the first initialization signal bus, and the other of the first transistor and the seventh transistor is coupled to the second initialization signal bus; or the second initialization signal bus is arranged in a same layer and made of a same material as the first initialization signal bus.

7. The display panel according to claim 3, further comprising:

a first data line, wherein the first data line is configured for providing a data voltage to the edge sub-pixel driving circuit, the first data line and the first source/drain metal layer are made of a same material, the first data line is arranged between the power supply signal line and the first initialization signal bus, and an orthographic projection of the first data line onto the base substrate partially overlaps the orthographic projection of the anode pattern onto the base substrate.

8. The display panel according to claim 7, further comprising:

a dummy data line, wherein the dummy data line is arranged between the first data line and the first initialization signal bus, and an orthographic projection of the dummy data line onto the base substrate partially overlaps the orthographic projection of the anode pattern onto the base substrate.

9. The display panel according to claim 8, wherein a distance between the dummy data line and the first initialization signal bus is 3 μm-7 μm, and a distance between the first initialization signal bus and the second initialization signal bus is 5 μm-30 μm.

10. The display panel according to claim 8, wherein a width of the first initialization signal bus is 30 μm-40 μm, and a width of the second initialization signal bus is 30 μm-40 μm.

11. The display panel according to claim 8, wherein the first data line and the dummy data line are arranged at two opposite sides of the center point of the anode pattern, respectively.

12. The display panel according to claim 2, further comprising:

a planarization layer arranged between the anode pattern and the first source/drain metal layer, wherein the planarization layer is configured for planarization between the anode pattern and the first source/drain metal layer.

13. The display panel according to claim 1, wherein at least one of the edge sub-pixels from the plurality of edge sub-pixels further comprises: a pixel-defining opening arranged at a side of the anode pattern distal to the base substrate, wherein the pixel-defining opening corresponds to the anode pattern, and an area of the pixel-defining opening is smaller than an area of the anode pattern.

14. The display panel according to claim 13, wherein an orthographic projection of the pixel-defining opening onto the base substrate overlaps the orthographic projection of the first initialization signal bus onto the base substrate at a third overlapping area, and an area of the third overlapping area is smaller than an area of the first overlapping area.

15. The display panel according to claim 13, wherein an orthographic projection of the pixel-defining opening onto the base substrate does not overlap the orthographic projection of the first initialization signal bus onto the base substrate.

16. The display panel according to claim 13, wherein the anode pattern comprises a main portion and an auxiliary portion coupled to each other, and a center point of the pixel-defining opening coincides with a center point of the main portion of the anode pattern.

17. The display panel according to claim 1, wherein the display panel comprises a plurality of sub-pixels, the plurality of sub-pixels are arranged in ana Red Green Blue Green (RGBG) format, and the edge sub-pixels are green pixels that are arranged at the edge of the display region and close to the border region, or wherein the plurality of sub-pixels are further arranged in a Green Green Red Blue (GGRB) format, a Diamond format, a standard Red Green Blue (s-RGB) format, or a Delta format.

18. A display device comprising the display panel according to claim 1.

19. The display panel according to claim 1, further comprising a second source/drain metal layer arranged on the base substrate, wherein the first initialization signal bus and the second source/drain metal layer are made of a same material.

* * * * *